(12) United States Patent
Hobelsberger et al.

(10) Patent No.: US 7,649,470 B2
(45) Date of Patent: *Jan. 19, 2010

(54) METHOD AND APPARATUS FOR DETECTION OF BRUSH SPARKING AND SPARK EROSION ON ELECTRICAL MACHINES

(75) Inventors: Max Hobelsberger, Wuerenlingen (CH); Ingo Kirchhoff, Bellikon (CH)

(73) Assignee: Alstom Technology Ltd., Baden (CH)

( * ) Notice: Subject to any disclaimer, the term of this patent is extended or adjusted under 35 U.S.C. 154(b) by 782 days.

This patent is subject to a terminal disclaimer.

(21) Appl. No.: 11/077,310

(22) Filed: Mar. 10, 2005

(65) Prior Publication Data

US 2005/0184751 A1     Aug. 25, 2005

Related U.S. Application Data

(63) Continuation of application No. PCT/EP03/50612, filed on Sep. 5, 2003.

(30) Foreign Application Priority Data

Sep. 10, 2002   (CH) .................................. 1530/02

(51) Int. Cl.
    *G08B 21/00*   (2006.01)
(52) U.S. Cl. ...................... 340/679; 340/660; 340/664; 324/772
(58) Field of Classification Search ................ 340/679, 340/680, 660, 664, 683, 681, 647; 324/772, 324/158, 500, 545, 546; 318/490; 702/58, 702/183
See application file for complete search history.

(56) References Cited

U.S. PATENT DOCUMENTS

| | | | |
|---|---|---|---|
| 3,653,019 A | 3/1972 | Barton et al. | 340/248 P |
| 3,831,160 A | 8/1974 | Cronin et al. | 340/256 |
| 4,058,804 A | 11/1977 | Sawade et al. | 340/248 |
| 4,163,227 A | 7/1979 | Sawade et al. | 340/662 |
| 4,451,786 A | 5/1984 | Sawade et al. | 324/158 |
| 4,577,151 A | 3/1986 | Tanisaka et al. | 324/158 |
| 4,806,719 A * | 2/1989 | Seerieder et al. | 219/69.13 |
| 4,814,699 A | 3/1989 | Koziel et al. | 324/158 MG |
| 4,831,295 A | 5/1989 | Posedel | 310/72 |

(Continued)

FOREIGN PATENT DOCUMENTS

DE     197 42 622     4/1999

(Continued)

OTHER PUBLICATIONS

International Search Report, International Application No. PCT/EP 03/050612, European Patent Office, Sep. 5, 2003.

*Primary Examiner*—Anh V La
(74) *Attorney, Agent, or Firm*—Darby & Darby

(57) ABSTRACT

A method and apparatus for detection of spark activity in an electrical machine having a shaft, wherein at least one of the shaft voltage and the shaft current is measured and analyzed for components which are characteristic of spark activity. The method uses the shaft voltages and/or shaft currents which are normally generally regarded only as being damaging has been found to be accurate and to be suitable for long-term monitoring of spark activities such as brush sparking, spark erosion, spark flashovers between parts of the shaft bearings and can be implemented physically very easily and in a reliable manner, since the existing grounding devices are used.

24 Claims, 1 Drawing Sheet

U.S. PATENT DOCUMENTS

| | | | |
|---|---|---|---|
| 5,006,769 A | | 4/1991 | Posedel ........................ 318/434 |
| 5,179,928 A | * | 1/1993 | Cour et al. ................... 123/606 |
| 5,307,017 A | * | 4/1994 | Maruyama et al. ........... 324/402 |
| 6,449,564 B1 | * | 9/2002 | Kliman et al. ................. 702/35 |
| 6,460,013 B1 | * | 10/2002 | Nippes ......................... 702/183 |
| 7,102,379 B2 | * | 9/2006 | Hobelsberger et al. ....... 324/772 |

FOREIGN PATENT DOCUMENTS

| | | |
|---|---|---|
| EP | 0 271 678 | 6/1988 |
| EP | 0 391 181 | 10/1990 |

\* cited by examiner

METHOD AND APPARATUS FOR DETECTION OF BRUSH SPARKING AND SPARK EROSION ON ELECTRICAL MACHINES

This patent application is a continuation for International Patent Application No. PCT/EP2003/050612, filed on Sep. 5, 2003, which claims priority to Swiss Patent Application No. CH 2002 1530/02, filed on Sep. 10, 2002. The entire disclosure of both applications is incorporated by reference herein.

The present invention relates to a method and an apparatus for detection of spark activity in an electrical machine, in particular of brush sparking and, for example, spark erosion that occurs in this case on sliprings, and/or spark flashovers between parts of the shaft bearings, such as shaft erosion sparks.

PRIOR ART

Spark activity in electrical machines which, for example, occurs in the form of brush sparking in generators with sliprings via which the field current is passed, or occurs in the form of spark flashovers between parts of the shaft bearings, is normally extremely critical since there is a risk of spark erosion. Such spark activity leads to the sliprings being worn away quickly and thus to possible premature failing of the contacts, and hence of the excitation field and thus of the entire electrical machine. Spark erosion on the shaft bearings leads to damage to the bearings and to the problems associated with this relating to quiet running and wear. There is therefore a major need to monitor and to identify in good time spark activity in electrical machines, in order to allow rapid action to be taken in the event of such damaging activity, or in order to make it possible to carry out appropriate steps, possibly with the aid of long-term monitoring, even before damaging spark activity occurs.

By way of example U.S. Pat. Nos. 3,653,019, 4,058,804, 4,163,227 and 4,451,786 describe methods and test equipment for monitoring of brush sparking. In these appliances, the signals for monitoring are tapped off directly at the brushes. The main aim of these documents is to distinguish between (useful) signals caused by brush sparking and (interference) signals. In order to observe the signals, specific tapping points must be provided on the brushes, in accordance with these documents. In this context, reference should be made in particular, for example, to U.S. Pat. No. 4,058,804, FIG. 2A of which shows typical signals, which are relevant in this context, and the combination of a useful signal and interference signal, in detail. The interference signals are in this case interference signals which originate from the static excitation device and which occur in a similar frequency range to the useful signals. In this case, a so-called "gating" method is used substantially to suppress the interference signals, that is to say a method in which the interference signal spikes, which can be identified specifically and occur periodically, are used in order to prevent the interference signal from reaching the detection stage (blanking) or in order to open the actual observation window only after a specific time after the occurrence of the interference signal (in order to prevent detection of the ringing that is associated with the interference signals).

Furthermore, U.S. Pat. No. 4,577,151 should be cited, in which brush sparking is detected via the arrangement of an antenna which must be provided specifically for this purpose. In this case, the antenna is arranged in the vicinity of the sliprings. The radio-frequency signals received by the antenna are passed to a radio-frequency amplifier, are demodulated and are then passed to a detector, where they are analyzed for components which are characteristic of brush sparking. This document also refers to an older system, in which a camera is used in order to record light flashes of sparks.

The apparatuses for detection of spark activity according to the prior art have the disadvantage that the outputting technique means that coupling devices which are specific for the brushes (for example high-reliability capacitances) must be installed, together with the corresponding output lines. The use of an antenna also requires the provision of a specific component, which also has to be installed in a suitable manner. One problem in conjunction with the "gating" which is used for the suppression of the interference signals is the fact that no measurements can be carried out in the period in which the interference is blanked out. This period may make up a considerable proportion of the available total time.

DESCRIPTION OF THE INVENTION

An object of the present invention is to provide a method and an apparatus for detection of the spark activity in an electrical machine, which is highly sensitive, is at the same time physically simple, and can be produced at low cost.

The present invention provides a method for detection of spark activity in an electrical machine, characterized in that the shaft voltage ($U_s(t)$) and/or the shaft current ($I_s(t)$) are/is measured and analyzed for detection of the spark activity.

As is described, for example, in the document EP-A1-0 271 678 and the subsequent document DE-A1-197 42 622, it is possible for shaft voltages and shaft currents to occur on the generator shaft of a generator, which is normally part of a turbine set, for various reasons, whose frequency spectrum extends from direct current up to frequencies which are related to the rotation frequency of the generator or else to the frequencies of a static excitation system for the generator.

Owing to magnetic imbalances in the area surrounding the generator shaft, electrostatic charges on the generator shaft, external electrical fields which capacitively input the shaft voltages into the generator shaft, or magnetic remanencies in the rotating shaft as well as residual magnetization (resulting from production) in the shaft can result in shaft voltages and shaft currents.

Fundamentally, the shaft voltages and shaft currents represent a risk to various components in the generator and can lead to damage to the generator if they are not reduced to a tolerable level. To this end, special precautions have been taken in the past on the generator shaft by, for example, installing insulating gaps at the non-drive end of the generator and by connecting the generator shaft to the ground potential via brushes at the drive end. In order to reduce the load on these brushes, proposals have also been made for the generator shaft to be AC-coupled to the ground potential at the non-drive end by means of a sliding contact and via a capacitance.

The shaft voltages and shaft currents may, however, also be used to monitor the functional reliability and suitability for use of the shaft grounding. The document EP-A1-0 271 678, which was cited initially, in this context specifies a monitoring and evaluation circuit which creates a direct-current path at the non-drive end of the generator by connecting a resistance in parallel with the dissipation capacitance and evaluates machine-typical frequency components in the currents flowing through this path. The RC combination results in a reliable link between the shaft and ground potential which reduces not only static charges but also low-frequency and higher-frequency voltages to levels which are safe for the shaft bearings, and limits any currents in the bearings to safe values. The insertion of the parallel resistance even results in redundancy for resistive ground at the drive end.

Another proposal (DE-A1-1 97 42 622) relates to the measurement of the shaft current flowing through a grounding section of the generator shaft at the drive end, and the determination of a frequency of the shaft current, from which the cause of the shaft current is then derived.

The present invention is based, in part, on the unexpected discovery that the shaft current and/or the shaft voltage contain/contains not only the information mentioned above according to EP-A1-0 271 678 relating to the suitability for use and the functional reliability of the shaft grounding, but also the information according to EP-A2-0 391 181, which must also be cited, relating to rotor turns shorts, but that these signals contain information about the spark activity in the electrical machine. It is therefore possible to dispense with the conventional apparatuses which must be provided specifically for the measurement of such spark activity and to measure the shaft voltage and/or shaft current using the appliances, which may already be present, for grounding, for monitoring the suitability for use and rotor turns shorts, and to use the data obtained in this way to draw conclusions about spark activities in the machine. The measurement of the shaft current and/or shaft voltage is in this case a sensitive method, which is very suitable for long-term observations, in order to determine such spark activities.

Fundamentally, this results in the advantage that it is possible to measure all the spark activities on the shaft (shaft sparks) for example discharges via the bearing shell, so that it is not just possible to measure just one specific type of spark activity.

According to a first preferred embodiment of the method according to the invention, the spark activity is brush sparking, that is to say sparks on the sliprings and/or spark flashovers between parts of the shaft bearings, in particular shaft erosion sparks. In this case, it is not just possible to determine the presence of a specific type of spark activity but also the time sequence and intensity of such activity. In this case, it is particularly preferable for analysis of the shaft voltage and/or shaft current for the signal to be measured and recorded as a function of time, and to be analyzed as a function of time.

According to a further preferred embodiment, the shaft voltage and/or the shaft current are measured by providing a low-impedance ground at a first point on the shaft and by providing a high-impedance RC module at a second point on the shaft, via which RC module the shaft voltage and/or shaft current are/is tapped off and are/is analyzed in an analysis unit.

In order, furthermore, to allow localization of the activity along the shaft, it is also preferably possible that, in addition to the measurement of the shaft voltage and/or the shaft current via the RC module the shaft voltage and/or the shaft current are/is tapped off via the low-impedance ground, are/is analyzed in the analysis unit.

Since the majority of the signals which are caused by spark activity are signals in the frequency range of above at least 500 kHz, and normally even above 700 kHz or even above 1 MHz, further signals which are not related to spark activity can be eliminated by passing the signal, or possibly the two or more signals, which is or are supplied to the analysis unit through a signal filter (high-pass filter) before analysis. This filter is preferably a variable, steep-flanked bandpass filter which, in particular and preferably, has a passband with a width of about 500 kHz, and whose mid-frequency can be tuned to about 500 kHz to 50 MHz.

In this case, the resultant signal (voltage or current) is preferably investigated for frequency modulations and/or amplitude modulations contained in it. The signal is in this case preferably analyzed after demodulation or down-mixing of the signal with a carrier frequency in relation to the mains period or rotationally synchronously with the shaft (phase-resolved measurement). This allows rotationally synchronized chattering marks on the excitation brush link or witness marks to be detected.

According to a further preferred embodiment, the measurement of the shaft voltage and/or shaft current is coordinated with a measurement of partial discharges at the phase terminals. This allows standard analysis of the situation with respect to spark activity, in particular with the localization of the spark activity being simplified. The causal relationship between the activity at the phase terminals and the spark activity can thus be produced easily, and it is possible to distinguish pulses from partial discharges in the stator winding from spark activities on the shaft, or to complement the partial discharge measurement.

According to another preferred embodiment, after passing through a high-pass filter as stated above, the signal is sampled and digitized. Then, either an analysis process is carried out on the time signal, possibly after matched gating in order to suppress interference signals, for spikes which are characteristic of spark activity, or sections of the signal are in each case Fourier-transformed and appropriate characteristic features in the frequency spectrum are analyzed. Normally, the interference signals are thyristor pulses resulting from rectification of the field voltage for the generator, which can likewise occur in the radio-frequency range, and which, in particular, can also lead to likewise disturbing ringing.

Further preferred embodiments of the method according to the invention are described in the dependent claims.

The present invention also relates to an apparatus for carrying out a method as has been described above. The apparatus is distinguished in particular in that the shaft voltage is tapped off via a sliding contact, preferably via the existing grounding device or devices. The radio-frequency component of the signal is output by means of coupling impedances, and is processed further.

In a further embodiment, a low-impedance ground is provided for the shaft at a first point on the shaft, and a high-impedance RC module is provided at a second point on the shaft. The shaft voltage and/or the shaft current are/is tapped off via the RC module and are/is analyzed in an analysis unit for components which are characteristic of spark activity on the shaft. In order to allow more accurate localization of the spark activity, it is also advantageous for the low-impedance ground to have a low resistance to the contact apparatus on the shaft and to have a high resistance to ground, with a fuse being arranged in parallel with the high resistance. In addition to the measurement of the shaft voltage and/or the shaft current via the RC module, the shaft voltage and/or shaft current are tapped off via the low-impedance ground, and are analyzed in the analysis unit.

Since, owing to the spark activity, the signals are normally radio-frequency signals, the analysis unit can also preferably have a high-pass filter, through which the signal, or possibly the two or more signals, which is or are supplied to the analysis unit is or are passed before analysis. The characteristic of the high-pass filter should in this case be variable and should have steep flanks, in particular and preferably having a passband with a variable lower limit of 20 kHz to 1 MHz or up to 5 MHz, and having an upper limit in the region of 40 MHz (for example a bandpass filter with a bandwidth of approximately 300 kHz, tunable).

Instead of the actual measurement on the RC module, it has been found to be advantageous for the RC module to have a fuse for the contact apparatus on the shaft and to ground via one or more capacitances, which are arranged in parallel, as well as via a resistance in parallel with them, with a measurement resistance (shunt resistance) being arranged, if required, between ground and the capacitance or resistance, and with the shaft voltage being tapped off via the one or more capacitances, and the shaft current being tapped off via the measurement resistance.

In this case, the measured shaft voltage and/or the measured shaft current are/is preferably detected as a function of time and are/is supplied to an analysis apparatus, with the analysis apparatus having means for digitization of the signal (voltage, current), means for Fourier transformation of this digitized signal, as well as means for spectral representation of the transformed data, with the presence, nature and intensity of spark activity being determined automatically, and being displayed in a simplified form, in particular, preferably and additionally numerically on the basis of the specific criteria. The criteria are in this case characteristic signals in the time domain, or characteristic spectral features of the individual activities.

Further preferred embodiments of the apparatus according to the invention are described in the dependent claims.

BRIEF DESCRIPTION OF THE DRAWING

The invention will be explained in more detail in the following text using exemplary embodiments and in conjunction with the drawing, in which.

DETAILED DESCRIPTION

Figure 1:
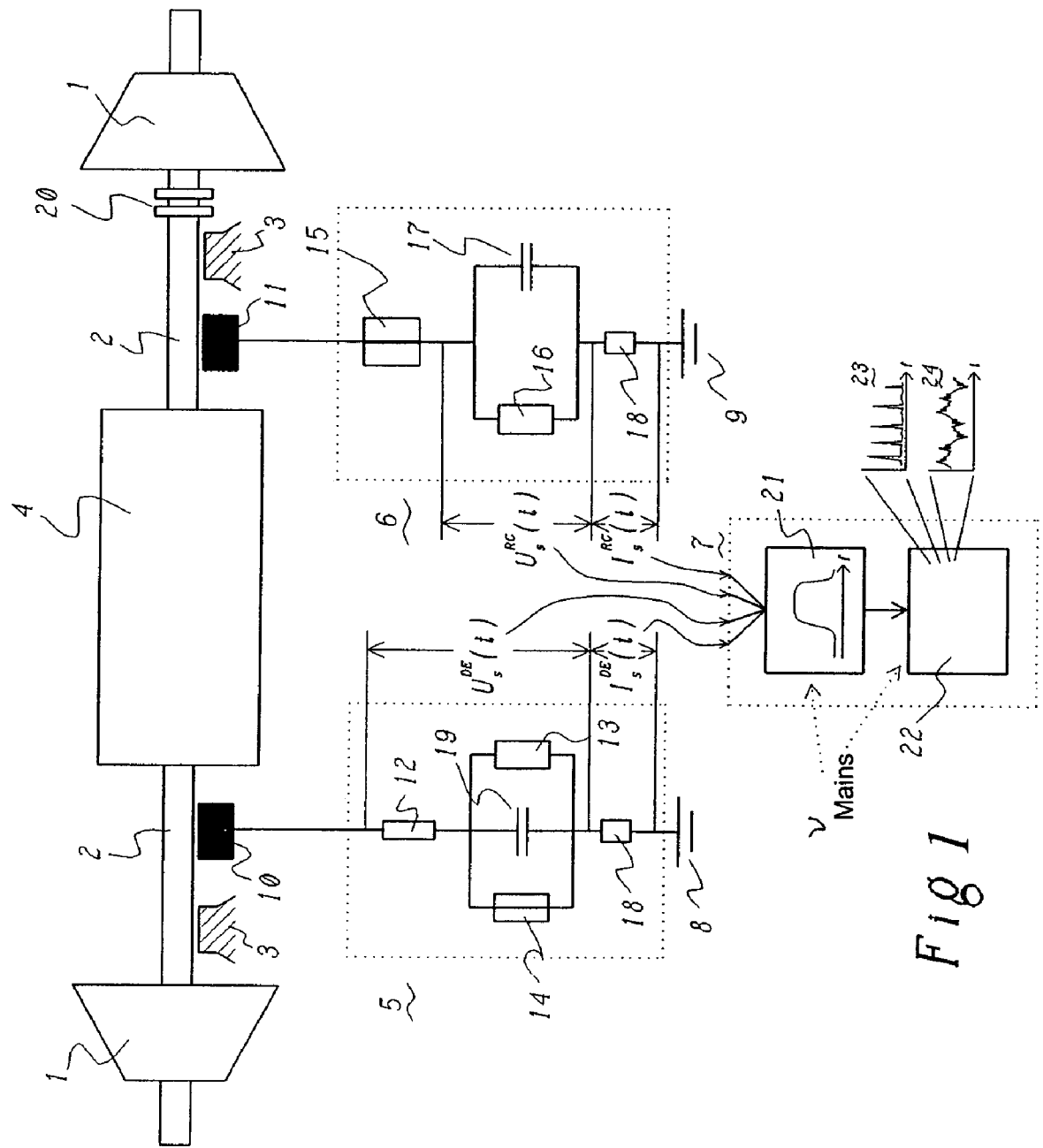
FIG. 1 shows a schematic illustration of an apparatus for measurement of the shaft voltage $U_s(t)$ and/or shaft current $I_s(t)$ as a function of the time (t).

FIG. 1 shows a schematic illustration of a gas turbine installation in which two turbines 1 are arranged in the two ends of a generator 4, with the two turbines 1, like the generator 4 as well, being arranged on a single common shaft 2. In this case, the two turbines should be regarded as being only by way of example, and it is also possible for only one turbine to be arranged. In order to make it possible to disconnect the generator 4 from the turbines 1, for example during acceleration, couplings are normally provided which allow the turbines 1 to be mechanically decoupled from the generator 4.

The shaft 2 is mounted on at least two shaft bearings 3. The oil films in the bearings 3 insulate the shaft 2 from the bearings 3, which are connected to ground. However, this insulation frequently collapses when voltage spikes occur on the shaft 2, and this can lead to electrical erosion problems. Sliprings 20, via which the feed for the field coils is input, are likewise located on the shaft 2.

As has already been mentioned in the introduction, shaft voltages and shaft currents occur on a shaft of a generator 4 such as this for various reasons, whose frequency spectrum extends from direct current up to frequencies which are related to the rotation frequency of the generator, or else to the frequencies of a static excitation system for the generator.

The shaft voltages and/or shaft currents are caused, inter alia, by magnetic imbalances in the area surrounding the shaft 2, electrostatic charges on the shaft 2, external electrical fields, which capacitively couple the shaft voltages to the shaft 2, or magnetic remanencies in the rotating shaft 2, as well as residual magnetization (from production) of the shaft 2.

The shaft voltages, which are referred to normally and in the following text as $U_s$, and shaft currents, which are referred to normally and in the following text as $I_s$, fundamentally represent a risk to various components of the generator and can lead to damage to the generator if they are not reduced to a tolerable level. Now, however, according to the invention the shaft voltage and/or the shaft current are/is used for deliberate analysis and detection of spark activities in the electrical machine.

For this purpose, a low-impedance ground 5, for example so-called DE module (drive end module) is connected to the shaft 2 at one end of the generator 4 and essentially ensures reliable grounding of the shaft 2 to ground 8. At the other end of the generator 4, a so-called RC module 6 (R for resistor, C for capacitance), which is connected to an analysis unit 7, is connected on one side to the shaft 2 and on the other side to ground 9.

The DE module 5 is connected to the shaft 2 via a contact apparatus 10. The contact apparatus 10 is preferably a copper mesh which makes a sliding electrical contact with the shaft 2. The DE module 5 has a low impedance to ground 8 by first of all connecting a low resistance 12 between the contact apparatus 10 and ground 8. The resistance 12 typically has a value R in the range from 1 to 50 ohms. The DE module 5 thus first of all ensures low-impedance grounding of the shaft 2. In order now to prevent possibly undesirable high currents in the shaft 2 being able to flow away directly via a low impedance to ground 8, a fuse 14 in series with the resistance 12 is arranged in parallel with a second, high resistance 13. This ensures that an undesirable current surge on the shaft 2 does not result in a low-impedance connection to ground 8, since this current is limited by the resistance 13. The fuse 14 is typically, for example, a fuse of the 2A/250V, inert type, which can easily be replaced from the outside, and the resistance 13 has a value R in the range from 100 to 1000 ohms. When such surges occur, the fuse 14 will blow appropriately, so that the high impedance 13 is now the major factor to examining the total resistance between the shaft 2 and ground 8. Furthermore, a capacitance 19 which is in the form of a capacitor is arranged in parallel with the resistance 13.

The RC module 6 is arranged at the other end of the generator 4. This likewise has a contact apparatus 11 to the shaft 2, which is once again preferably in the form of a copper mesh which makes electrical contact with the shaft 2. First of all, the RC module 6 has a fuse 15 to the shaft, normally a fuse of the 2A inert type (the fuse is also used for protection against high currents in this case), and, in series with this, a resistance 16, with the capacitance 17, which is likewise in the form of a capacitor, arranged in parallel with it. In an entirely general form, the resistance 16 which is arranged in parallel with the capacitance 17 has a value R in the range from 100 to 10 000 ohms. The capacitance 17 has a typical value C in the range from 1 to 30 µF.

The shaft voltage $U^{RC}_s(t)$ is now tapped off as a function of time across the capacitance 17 or across the resistance 16, and is passed via a coaxial cable to the analysis unit 7. A measurement resistance 18 (shunt resistance) is also connected between the ground 9 and the parallel arrangement formed by the resistance 16 and the capacitance 17, in which case the shaft current $I^{RC}_s(t)$ can be calculated and can also be described from the voltage drop which occurs across it. This information is also passed via a coaxial cable to the analysis unit 7.

The shaft voltage $U^{DE}_s(t)$ and $I^{DE}_s(t)$ can also be tapped off via the DE module 5. The shaft voltage is in this case tapped off across the resistance 12, and a measurement resistance 18 is also once again provided upstream of the ground 8 for tapping of the shaft current, in the case of which the shaft current $I^{DE}_s(t)$ can be calculated and can also be described by the voltage drop which occurs across it. This information is also passed via a coaxial cable to the analysis unit 7.

The measurement of shaft voltages and the shaft current at the two modules 5 and 6 allows rough localization of spark activity by comparison of the values.

The measured shaft voltage as a function of time $U_s(t)$ and the measured shaft current as a function of time $I_s(t)$ now contain information about the various, normally undesirable, spark activity in the electrical machine. These measurement variables are therefore used to measure similar signals to those which are known by direct coupling to the brushes or by the use of an antenna, as is known from the prior art.

The evaluation of the shaft current and/or the shaft voltage allows early diagnosis both of brush sparking (and of spark erosion associated with it) on the sliprings 20, which is evident in the form of signals such as those described and illustrated in U.S. Pat. No. 4,163,227. In addition, however, further spark activity can be diagnosed on the shaft 2, such as spark erosion on the bearings 3. Both cases relate to characteristic spikes in the shaft voltage and surges in the shaft current. Since these signals which are typical of spark activity are radio-frequency signals, that is to say signals typically in the frequency range above 500 kHz, it has been found to be advantageous to pass the shaft voltages and/or shaft current through a signal filter 21, which is in the form of a bandpass filter, before the actual analysis in the evaluation unit 22. The commutation signals (thyristor pulses), which could cover the useful signal as interference signals, are normally at a rather low frequency. In addition, further interference signals can be suppressed in this way. In particular, the filtering also makes it possible to observe spark activities in the time period off the thyristor pulses.

This bandpass filter 21 is a band-selective receiver, demodulator and amplifier, which has steep flanks and is adjustable. Adjustable means that it can cover a frequency range from 20 kHz to 40 MHz, with the mid-frequency being variable, with a bandwidth of, for example, 300 kHz. In the context mentioned here, a lower limit of at least 20 kHz has been found to be possible, in which case interference signals on the useful signals that are relevant here can typically be essentially precluded only above 500 kHz.

The signal which is passed through the bandpass filter 21 is then sampled and digitized in the unit 22, with a normal sampling frequency of at least 200 kHz. The signal can then be investigated directly for characteristic spikes in the time domain, as is indicated by the reference symbol 24 in the figure. In addition, it is possible to represent the signal with respect to the mains frequency $V_{mains}$ in order to identify periodicity in conjunction with rotation of the shaft (phase resolution).

Furthermore, analysis based on a Fourier transformation of the time signal $U_s(t)$ or $I_s(t)$ has also been found to be a suitable approach for analysis. In order to improve the measurement accuracy and/or to simplify the filtering of the input data, the corresponding time signal can in this case as well be mixed with a carrier signal and can be Fourier-transformed (FFT). In this case, by way of example, the mains frequency is also suitable for use as a carrier signal which, if required for this purpose, must be tapped directly off the mains or else some other suitable point. The data as represented in the frequency domain is indicated by the reference symbol 23 in the figure.

The input signal $U_s(t)$ (typically in the region below 3V) or Is(t) is initially digitized in an analog/digital converter (ADC) with a sampling frequency (sampling rate) of typically 200 kHz, and this digitized time signal $U_s(t)$ or $I_s(t)$, respectively, is then subjected to a Fourier transformation in sections.

In this context, it should also be noted that the present method is very particularly suitable for long-term observation of the behavior of electrical installations. For example, it is possible to use the gradual slow change in the behavior of the spark activities to deduce the possible requirement for maintenance work, and appropriate maintenance work can be planned and carried out specifically.

What is claimed is:

1. A method for detection of spark activity in an electrical machine having a shaft, the method comprising:
    measuring at least one of a shaft voltage and a shaft current so as to obtain a measured signal;
    performing an analysis of the measured signal using an analysis unit;
    detecting the spark activity based on the analysis;
    tapping off at least one of the shaft voltage and the shaft current using a low-impedance ground connected to the shaft via a contact apparatus and connected to ground, the low-impedance ground including a low resistance connected to the contact apparatus, a high resistance connected to the ground, and a fuse disposed in parallel with the high resistance so as to provide a tapped off signal; and
    sending the tapped off signal to the analysis unit for analysis.

2. The method as recited in claim 1, wherein the spark activity includes brush sparking.

3. The method as recited in claim 1, wherein the electrical machine includes sliprings and shaft bearings having bearing parts, and wherein the spark activity includes at least one of sparks occurring on one of the sliprings and spark flashovers between the bearing parts.

4. The method as recited in claim 1, wherein the measuring is performed as a function of time.

5. The method as recited in claim 1, wherein the measuring is performed over at least one sliding contact.

6. The method as recited in claim 1, wherein the measuring is performed using at least one grounding device.

7. The method as recited in claim 1, wherein a high-impedance RC module is provided at one point on the shaft, and wherein the measuring includes tapping off at least one of the shaft voltage and the shaft current using the RC module and wherein the analysis is performed in the analysis unit.

8. The method as recited in claim 1, further comprising passing at least one of the measured signal and the tapped off signal through a signal filter before the analysis.

9. The method as recited in claim 8, wherein the signal filter includes a variable, steep-flanked bandpass filter.

10. The method as recited in claim 9, wherein the bandpass filter is followed by an amplitude demodulator.

11. The method as recited in claim 1, further comprising determining whether the measured signal contains at least one of frequency modulations and amplitude modulations before the analysis.

12. The method as recited in claim 11, further comprising synchronously demodulating the measured signal in phase to the mains voltage.

13. The method as recited in claim 1, wherein the electrical machine includes phase terminals, and further comprising coordinating the measuring of the at least one of the shaft voltage and the shaft current with a discharge measurement of partial discharges at the phase terminals.

14. The method as recited in claim 8, further comprising sampling and digitizing the at least one of the measured signal and the tapped off signal downstream from the signal filter, and wherein the analysis includes at least one of analyzing the at least one signal for spikes characteristic of spark activity and performing a Fourier transformation on sections of the at least one signal so as to analyze at least one characteristic feature in the frequency spectrum.

15. The method as recited in claim 14, further comprising suppressing interference signals in the at least one signal using matched gating.

16. The method as recited in claim 15, wherein the interference signals include thyristor pulses resulting from rectification of an excitation for the electrical machine.

17. An apparatus for detection of spark activity in an electrical machine having a shaft, the apparatus comprising:
  a grounding module disposed at a point on the shaft and configured to tap off at least one of a shaft voltage and a shaft current so as to provide a measured signal;
  an analysis unit configured to analyze the measured signal for at least one component characteristic of spark activity; and
  a low-impedance ground connected to the shaft via a contact apparatus and connected to a ground, the low-impedance ground including a low resistance connected to the contact apparatus, a high resistance connected to the ground, and a fuse disposed in parallel with the high resistance, wherein the low-impedance ground is configured to tap off at least one of the shaft voltage and the shaft current so as to provide a tapped off signal and to send the tapped off signal to the analysis unit for analysis.

18. The apparatus as recited in claim 17, wherein the analysis unit includes a signal filter through which at least one of the measured signal and the tapped off signal are supplied to the analysis unit.

19. The apparatus as recited in claim 18, wherein the signal filter includes a variable steep-flanked bandpass filter.

20. The apparatus as recited in claim 19, wherein the bandpass filter has a passband with an adjustable lower limit from 20 kHz to 5 MHz and an upper limit in the region of 40 MHz.

21. The apparatus as recited in claim 17, wherein the grounding module includes an RC module having a fuse, a contact apparatus for contacting the shaft, one or more capacitances arranged in parallel, a resistance to ground disposed in parallel with the one or more capacitances, and wherein the shaft voltage is tapped off using the one or more capacitances.

22. The apparatus as recited in claim 21, wherein the RC module includes a measurement resistance disposed between the ground and the parallel arranged one or more capacitances and the resistance to ground, and wherein the shaft current is tapped off across the measurement resistance.

23. The apparatus as recited in claim 17, the grounding module is configured to provide the measured signal as a function of time, and wherein the analysis unit includes an element configured to digitize the signal, an element configured to perform a Fourier transformation of the digitized signal, and an element configured for spectral representation of the transformed data, and wherein at least one of the presence, nature and intensity of spark activity is determined automatically and displayed in a simplified form on the basis of the specific criteria.

24. The apparatus as recited in claim 23, wherein at least one of the presence, nature and intensity of spark activity is displayed in a simplified form and additionally numerically.

* * * * *